United States Patent
Naidu et al.

(10) Patent No.: US 7,009,406 B2
(45) Date of Patent: Mar. 7, 2006

(54) ARC FAULT DETECTOR AND METHOD

(75) Inventors: Malakondaiah Naidu, Troy, MI (US); Thomas J. Schoepf, Rochester Hills, MI (US); Suresh Gopalakrishnan, Sterling Heights, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/831,733

(22) Filed: Apr. 23, 2004

(65) Prior Publication Data

US 2004/0263183 A1    Dec. 30, 2004

Related U.S. Application Data

(60) Provisional application No. 60/465,061, filed on Apr. 24, 2003.

(51) Int. Cl.
*G01R 31/12* (2006.01)

(52) U.S. Cl. .......................................... 324/536; 361/42

(58) Field of Classification Search ................. 324/536, 324/539, 520–522, 541–544; 340/647, 657, 340/658; 361/42, 90; 702/58
See application file for complete search history.

(56) References Cited

U.S. PATENT DOCUMENTS

| | | | |
|---|---|---|---|
| 5,359,293 A * | 10/1994 | Boksiner et al. ............ 324/544 |
| 5,986,860 A | 11/1999 | Scott ........................... 361/42 |
| 6,229,679 B1 | 5/2001 | Macbeth et al. .............. 361/42 |
| 6,477,021 B1 | 11/2002 | Haun et al. ................... 361/42 |
| 6,504,692 B1 | 1/2003 | Macbeth et al. .............. 361/42 |
| 6,577,484 B1 | 6/2003 | Macbeth et al. .............. 361/42 |
| 6,683,766 B1 | 1/2004 | Guo et al. .................... 361/42 |
| 6,833,713 B1 | 12/2004 | Schoepf et al. ............. 324/536 |
| 2001/0029433 A1 * | 10/2001 | Scott ........................... 702/58 |

* cited by examiner

*Primary Examiner*—Vincent Q. Nguyen
(74) *Attorney, Agent, or Firm*—David P. Wood

(57) ABSTRACT

The present invention discloses an arc fault detector including a shunt resistor deployed in a circuit being protected, an arc discriminator sensing voltages across the shunt resistor and outputting an arc detection signal when it detects current variations caused by parallel and series arc faults, a signal transformer buffering the arc detection signal and outputting a pulse, a switch transient detector detecting a voltage differential across load switches and outputting a pulsed switch transient detection signal when the voltage differential across load switches exceeds a reference value, a line interrupter such as a static relay, a switch controller including logic gates generating a trip signal based on predetermined criteria, and a manual switch for resetting the line interrupter. A second embodiment of the present invention senses voltage induced in a coil wrapped around a toroidal core to detect current variations in conductors which pass through the center of the toroidal core.

9 Claims, 9 Drawing Sheets

ARC FAULT DETECTOR AND METHOD

PRIORITY

This application claims benefit of priority from U.S. provisional patent application Ser. No. 60/465,061, filed Apr. 24, 2003, which is hereby incorporated by reference.

TECHNICAL FIELD

The present invention relates generally to the protection of electrical circuits, and, more specifically to systems and methods for detecting and preventing electrical arcing in series and parallel electrical circuits.

BACKGROUND OF THE INVENTION

In many electrical systems, a need may arise to increase the voltage potential applied to elements within the system. This need may arise for many reasons including, for example, power source considerations, load considerations, and power transmission considerations. For example, in the automotive industry, need currently exists to increase the electrical power capability for future vehicles caused by design considerations associated with reducing fuel consumption and the introduction of new and/or improved electrical features and devices. In some situations, new power networks must be sized to accommodate increased energy demands associated with new devices designed and implemented for comfort, security, and safety in addition to servicing the electrical needs of major systems such as braking, electric power steering and suspension systems. In consideration of demands from the marketplace, it is contemplated that the electrical potential of some direct current (DC) systems may be increased from the currently common level of between 6 and 15 volts to significantly higher levels, such as between 20 and 60 volts. Many systems currently under consideration for the automotive industry rely upon a potential of 42 volts. It is contemplated that higher voltage systems, and subsystems, may be devised in the future.

The introduction of such increased voltage systems, for example, systems with potentials exceeding approximately 20 volts, however, causes considerable additional component and system modifications to ensure the reliability and electrical safety of such systems. More specifically, the impact of an increased voltage in an electrical system that utilizes a forty-two volt, direct current network, is to require attention to be focused on the arcing phenomenon that can occur within electrical distributions systems and components. It should be noted that such electrical arcing may occur as a result of cut, pinched or chaffed wiring. Accordingly, a need exists to develop systems and methods for preventing and detecting arcing within such systems, which may include, for example, wire harnesses within automotive, aerospace, appliance, medical instruments or other such devices where electrical arcing is to be avoided.

In the instance of a wire being cut or broken under an electrical load, an arc may be drawn across the gap created by the break or cut, between the exposed ends of the wire. Such an arc is often undesirable, its effects may not have been considered, and no provision may have been made to enable its extinction. In many cases, severe damage may occur if such an arc is sustained. It should be noted that, as used herein, the term "series arc fault" refers to arc faults that occur when an arc is situated in series with a load. Hot unplugs that may be caused by loose connections are often series arc faults. Unfortunately, however, series arc faults cannot typically be cleared by fuses or circuit breakers.

Arc faults in parallel to the load are identified as parallel arc faults. An example of parallel arc faults can be damaged wires drawing an arc to a ground potential, such as a chassis of an automobile. In an electrical system, the insulation jacket of one or more wires might become broken due to aging, mishandling, or damage (e.g., shaved, chaffed or pinched cable jackets). In such cases, an arc fault may be created, causing a temporary short circuit. The arc fault current, however, may thermally over-load and damage contacts within the circuit due to low contact force, resulting in melting and evaporating contact material, which may be followed by still more arcing. The arc fault current, which is typically related to, and limited by, the circuit impedance and the arc voltage, can be significantly lower than the trip current of the protection device, such as the fuse or circuit breaker. As a result, the time required for clearing the fault often depends on the time or current characteristics of the system and may not occur until too late, if at all.

While this disclosure makes extensive use of examples drawn from the automobile, it should understood that both the needs described herein and the inventive solutions disclosed are applicable to many other fields of use such as the aerospace industry, manufacturing equipment, recreational vehicles, medical equipment, appliances, arc-welding equipment, and any other field where an electrical device may encounter electrical arcing—especially devices utilizing DC sources of voltage. It should be noted that vehicles, especially flight vehicles, may require additional considerations due their associated weight and reliability considerations. It should be understood that electrical arcing may occur even at low voltages, and the effects of such arcing, and the importance of its detection and/or prevention depends upon the system and environment in which the arc occurs. The ability of individual systems to withstand arcing may depend highly upon the specifics of the system. For example, where an electrical system is to be exposed to an extremely volatile substance, such as within a fuel tank of an aircraft or other vehicle, electrical arcing may be extremely serious, and must be mitigated—regardless of the voltage potential of the system.

Consequently, there remains a need in the art for arc detection and protection systems and methods, primarily for DC circuits, capable of rapidly detecting parallel arcs and/or series arcs. It would be beneficial to have a system and method capable of distinguishing unwanted and unplanned arcs from expected or tolerated transient arcs, such as those that might be expected to be caused by the opening of a load switch. It would be further beneficial to be able to utilize arc detection components, such as sensors and the like, that are sufficiently compact to enable them to be incorporated in devices such as electrical connectors, junction blocks, relays, circuit breakers, and the like. It would also be desirable to have a system and method for continuously monitoring for arcing conditions rather than periodically sampling. It would further be desirable to have an arc detection and protection system that uses low cost components without requiring the use of microprocessors or complex algorithms.

SUMMARY OF THE INVENTION

The methods and apparatus of the present invention address many of the shortcomings of the prior art. The present invention provides systems and methods for detecting an arc fault. In an exemplary embodiment, the instant invention detects a change in current that is indicative of an arc fault. In an exemplary embodiment of the invention, a system distinguishes an arc fault from a slow current transient that may be caused by a load variation or a low-frequency commutation ripple current such as that which might be associated with a DC motor under normal operating conditions. An exemplary embodiment of the invention includes a switch transient detector that detects voltage differential across a load switch and generates a switch transient signal that may be used to prevent a trip signal from being generated. Accordingly, this embodiment may eliminate or minimize the impact of nuisance tripping of a circuit interrupter, helping to enable, where appropriate, the elimination of costly microprocessors and complex algorithms to distinguish switch transients.

In an exemplary embodiment, a system for detecting a current change indicative of an arc fault comprises a current shunt resistor coupled at the input side of a protected load. In an exemplary embodiment, the current shunt resistor is sufficiently small to be deployed in a smart electrical connector and smart junction blocks.

In another exemplary embodiment, a pickup coil wound on a toroidal or UI type magnetic core is coupled at the input side of a protected load to detect a current change indicative of an arc fault. In this embodiment, the invention is capable of being deployed at only an input side or only a load side without a need for sensors, wires, and other components to be deployed on both a load and input side.

In an exemplary embodiment, an arc fault detector according to the present invention includes a current shunt resistor coupled in series with a circuit and an arc discriminator including an amplifier sensing a first voltage on a first side of the current shunt resistor, sensing a second voltage on a second side of the current shunt resistor, and producing a first signal proportional to a current flow through the current shunt resistor. The arc discriminator further includes a change detector receiving the first signal as input and producing an arc fault detection signal as output when the change detector detects a change in the first signal indicative of a presence of an arc fault in the circuit. In an exemplary embodiment, a change detector includes a series arc detector and a parallel arc detector.

Another exemplary embodiment of an arc fault detector according to the present invention includes a current monitor configured for detecting a rate of change in electrical current in the circuit and producing a first signal indicative of the rate of change. The arc fault detector further includes a filter connected in series with the circuit monitor filtering the first signal to substantially eliminate signals outside a selected frequency range. The filter produces a filtered signal that is configured to represent a change in the electrical current within the selected frequency range. The arc fault detector may also include an arc determiner configured to produce an arc detection signal when a voltage level of the filtered signal exceeds at least one threshold.

In an exemplary embodiment, the current monitor may be a toroidal coil wrapped around a magnetic or UI core and the arc determiner may be a Schmitt Trigger.

In accordance with another aspect of the invention, an exemplary method for detecting an arc fault in a circuit in accordance with present invention includes coupling a current shunt resistor in the circuit, monitoring a voltage differential across the current shunt resistor, detecting a change in the voltage differential, comparing the change to at least one threshold, and may also include generating a signal when the change exceeds the at least one threshold.

Another exemplary method for detecting an arc fault in a circuit in accordance with present invention may also include providing a coil wrapped around a toroidal core, passing at least one conductor of the system through the center of the toroidal core, detecting a voltage induced in the coil by a change in current flowing through the at least one conductor, filtering the voltage so as to eliminate signals outside a selected frequency range and to produce a filtered signal, comparing the filtered signal to at least one threshold; and generating an arc detection signal when said filtered signal exceeds said at least one threshold.

These and other features and advantages of the present invention will become apparent from the following brief description of the drawings, detailed description, and appended drawings.

BRIEF DESCRIPTION OF THE DRAWINGS

The above-mentioned features of the present invention can be more clearly understood from the following detailed description considered in conjunction with the following drawings, in which like numerals represent like elements and in which.

DETAILED DESCRIPTION OF THE INVENTION

As discussed above, the methods and systems of the present invention provide improved arc fault detection capable of detecting series and parallel arcs in a DC circuit using low cost electronics, enabling the avoidance, where appropriate, of microprocessors or sophisticated algorithms.

Figure 1:
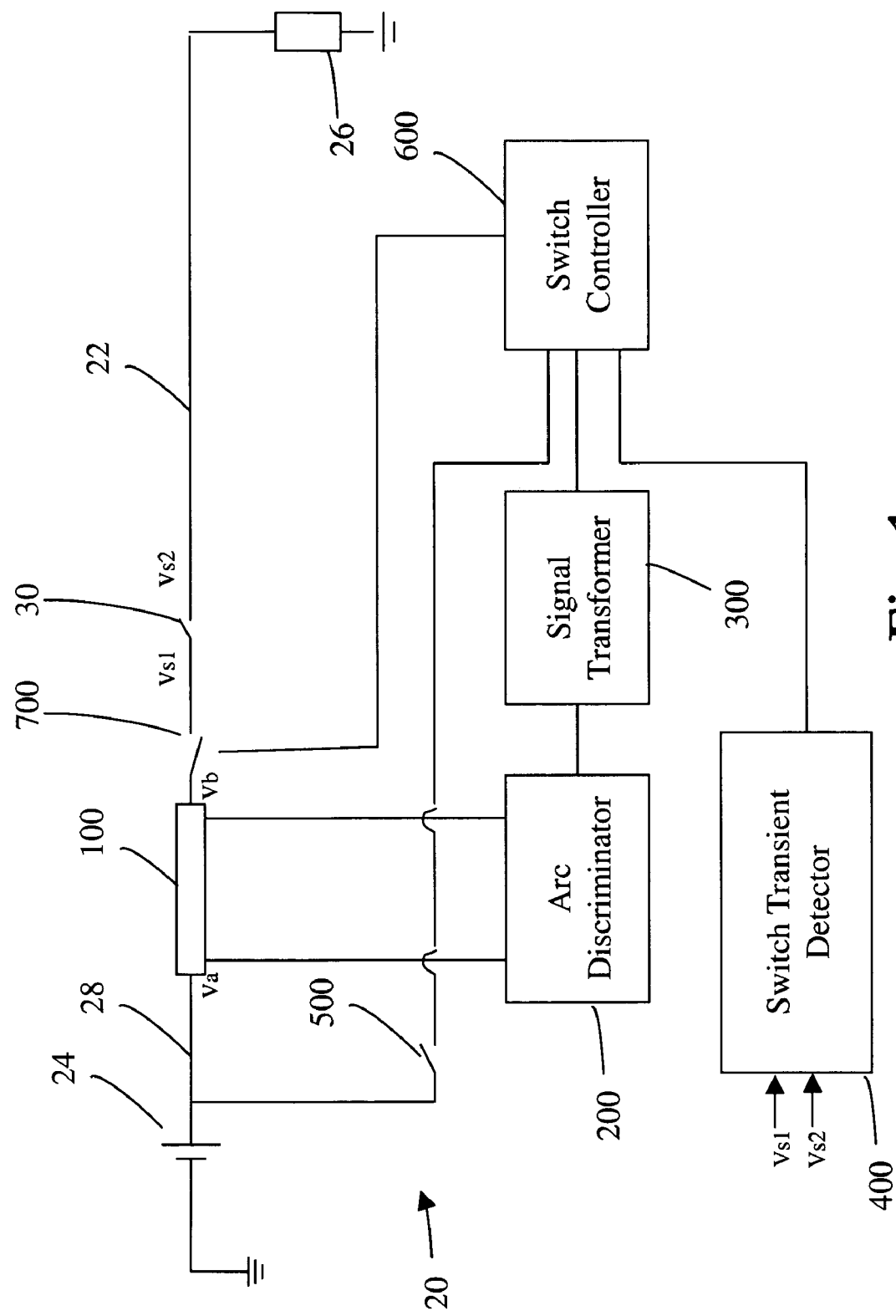
FIG. 1 is a simplified block diagram of a system incorporating an exemplary embodiment of an arc fault detector in accordance with the present invention.

Referring first to FIGS. 1–4, FIG. 1 is a simplified diagram illustrating a first exemplary embodiment of an arc fault detector 20 of the present invention. As shown in FIG. 1, arc fault detector 20 provides protection to circuit 22. Circuit 22 includes direct current power source or battery 24 providing power to load 26 via conductor 28. Load switch 30 is disposed in conductor 28.

Arc fault detector 20 includes current shunt resistor 100, arc discriminator 200, signal transformer (i.e., an arc fault signal generator) 300, switch transient detector 400, manual switch 500, switch controller 600, and line interrupter 700.

Current shunt resistor 100 is coupled to circuit 22 in series with conductor 28. Arc discriminator 200 detects a voltage differential across current shunt resistor 100, produces a signal proportional to a current flow through the current shunt resistor 100, and detects a change in the signal to produce an arc fault detection signal when a series arc fault or parallel arc fault is detected.

Signal transformer 300 generates a pulse in response to detection of the arc fault detection signal. The pulse, which is a signal indicative of an arc fault, has a width which extends for period of time that an arc fault is detected.

Switch transient detector 400 detects a voltage differential across load switch 30 and outputs a pulsed switch transient detection signal when the voltage differential across load switch 30 exceeds a reference value. The reference value is set at a level indicating an opening of load switch 30. As later described, switch transient detector 400 may include inputs to detect voltage differential across multiple load switches and one or more logic gates to output a switch transient detection signal if a voltage differential across any one of the switches exceeds a reference value. Manual switch 500 is used to manually close and open line interrupter 700.

Switch controller 600 senses the pulse output from signal transformer 300, switch transient detection signal from switch transient detector 400, and voltage provided by battery 24 via manual switch 500. In an exemplary embodiment, switch controller 600 uses logic gates to output a trip signal controlling line interrupter 700.

Figure 2:
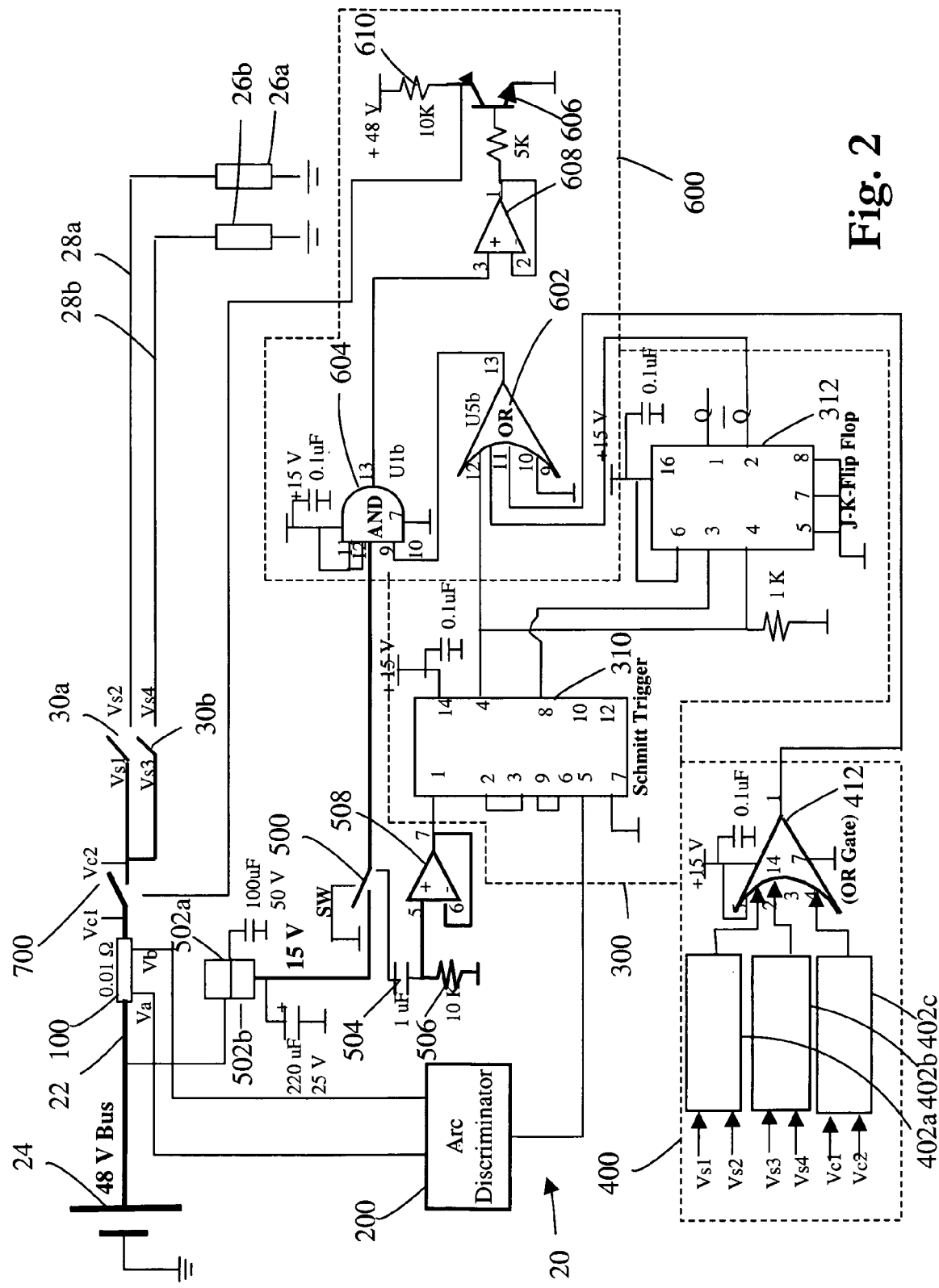
FIG. 2 is a circuit diagram of a system incorporating an exemplary embodiment of an arc fault detector in accordance with the present invention.

Referring now to FIG. 2, arc fault detector 20 provides protection to circuit 22. Circuit 22 includes direct current power source or battery 24 providing power to loads 26a, 26b via conductors 28, 28a, 28b. Load switch 30a, 30b is disposed in each of conductors 28a, 28b, respectively.

Shunt resistor 100 is coupled in series with circuit 22 and also in series with conductor 28. Arc discriminator 200 senses a voltage $v_a$, $v_b$ at each side of current shunt resistor 100.

Figure 3:
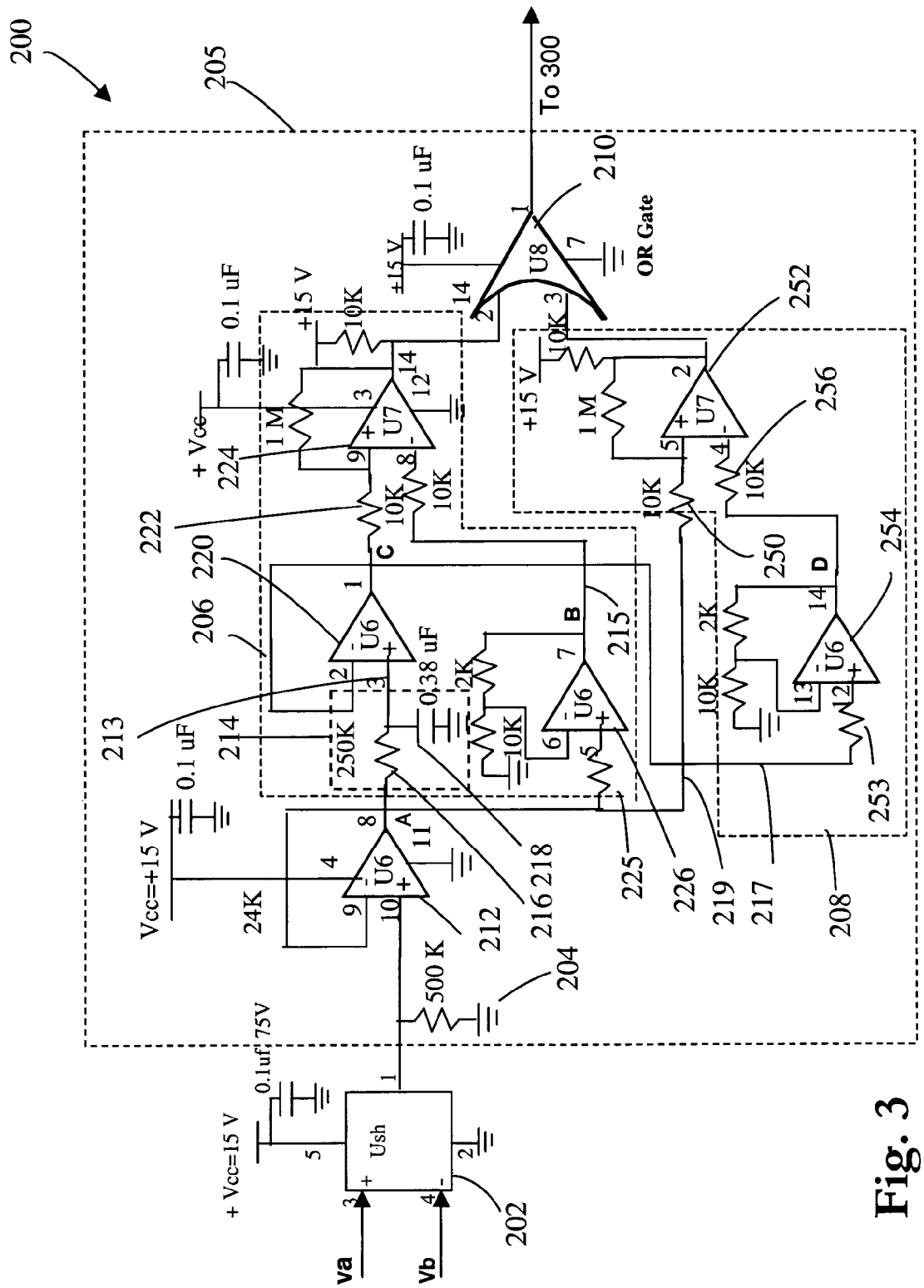
FIG. 3 is a circuit diagram illustrating an aspect of a fault detector in accordance with the present invention.

As shown in FIG. 3, arc discriminator 200 includes a current shunt amplifier 202 and change detector 205. Current shunt amplifier 202 senses voltages $v_a$, $v_b$ from each side of current shunt resistor 100 at input terminals 3 (+ve) and 4 (−ve), respectively. For convenience, it is assumed that $v_a$ is more positive than $v_b$, such that current would flow from $v_a$ to $v_b$ in current shunt resistor 100. Current shunt amplifier 202 outputs a voltage signal to change detector 205. In this embodiment, the voltage signal is indicative of (e.g., proportional to, related to) the current flowing through current shunt resistor 100. Change detector 205 includes output resistor 204 connected to pin 1 of current shunt amplifier 202. Change detector 205 further includes series arc fault detector 206 and parallel arc fault detector 208 each feeding an output signal to OR Gate 210, as further described below.

Current shunt amplifier 202 is coupled to an input of first buffer 212. First buffer 212 has a first output connected to first delay circuit 213 and a second output connected to first reference circuit 215. First delay circuit 213 provides a delayed signal as an output to a first input of first comparator 224. First reference circuit 215 provides a reference signal as an output to a second input of first comparator 224. Series arc fault detector 206 includes first delay circuit 213, first reference circuit 215, and first comparator 224.

First delay circuit 213 includes low pass filter (R-C circuit) 214 including resistor 216 and capacitor 218. First delay circuit 213 further includes second splitter or buffer 220 and resistor 222. First reference circuit 215 includes resistor 225 connected to an input of amplifier 226. First comparator 224 is configured to output a series arc detection signal only when a voltage at an output of first delay circuit 213 is greater than a voltage at the output of first reference circuit 215. This condition occurs when there is a decrease in a voltage signal provided by the output of current shunt amplifier 202, which causes the voltage in first reference circuit 215 to decrease. The time delay provided by low pass filter 214 delays a decrease in voltage in first delay circuit 213, enabling the voltage in first delay circuit 213 to exceed the voltage in first reference circuit 215. It should be noted that first reference circuit 215 includes amplifier 226, which provides a gain. First comparator 224 outputs to a first input of OR Gate 210. OR Gate 210 is configured to output an arc fault detection signal when the series arc fault detection signal is detected at the first input.

Parallel arc fault detector 208 includes a second delay circuit 217 which originates from a second output of second buffer 220, a second reference circuit 219, which originates from the second output of first buffer 212, and second comparator 252.

Second delay circuit 217 includes resistor 253 connected to an input of amplifier 254. Second reference circuit 219 includes resistor 250.

Second delay circuit 217 provides a delayed signal as an output to a second input of second comparator 252. Second reference circuit 219 provides a reference signal as an output to a first input of second comparator 252.

Second comparator 252 is configured to output a parallel arc detection signal only when a voltage at the output of delay circuit 217 is less than a voltage at the output of reference circuit 219. This condition occurs when there is an increase in the voltage signal provided by the output of current shunt amplifier 202, which causes the voltage in reference circuit 219 to increase. The time delay provided by low pass filter 214 delays an increase in voltage in delay circuit 217, enabling the voltage in reference circuit 219 to exceed the voltage in delay circuit 217. It should be noted that delay circuit 217 includes amplifier 254, which provides a gain.

Second comparator 252 outputs to a second input of OR Gate 210. OR Gate 210 is configured to output an arc fault detection signal when the parallel arc fault detection signal is detected at the second input.

In a series arc condition, the current flowing through current shunt resistor 100 decreased with respect to a normal condition. The output signal from current shunt differential amplifier 202 is buffered with splitter or buffer 212, and the buffered voltage at first output 8 is fed to low pass filter 214. Resistor 216 and capacitor 218 are implemented to introduce a time delay into the signal and to filter low frequency ripple due to motor loads. The output of low pass filter 214 is buffered by buffer 220 and fed to input resistor 222 connected to the +ve input 9 of comparator 224. The amplified signal of buffer 212 is fed to input resistor 225 of buffer 226, connected to the −ve 8 input of comparator 224. Comparator 224 compares voltage input at pin 8 with time delayed voltage input at pin 9 to detect a change in voltage that exceeds a gain provided by amplifier 226. The amplifier gain is selected such that comparator 224 does not produce output voltage under normal conditions. In an exemplary embodiment, a gain of 1.1 to 1.2 is selected.

In use, when a series arc occurs, the current suddenly drops initially and current shunt amplifier 202 produces a voltage proportional to the arc current at location "A" and also at location "B." The magnitudes of the voltages at these points are depressed relative to the voltages under normal load such as prior to the occurrence of an arc fault. Low pass filter 214 filters the voltage transient caused by the arc current momentary and the buffered output voltage at location "C" is the same as it was prior to the occurrence of the arc fault, which is elevated (i.e., greater in magnitude, regardless of polarity) relative to the voltage at location "B." This condition allows comparator 224 to produce output voltage, which is fed to input 2 of OR Gate 210.

In the case of a parallel arc fault condition, the current flowing through current shunt resistor 100 increases relative to a normal load condition. The buffered output of current shunt amplifier 202 at location "A" is connected to input resistor 250, connected to the +ve input 5 of a comparator 252. The buffered and time delayed filter output at location "C" is fed to amplifier 254 to produce output at location "D," which is slightly lower than at location "A." This signal is fed to input resistor 256, connected to the −ve input 4 of comparator 252. Under normal load conditions or under series arc fault condition, comparator 252 does not produce an output voltage. When a parallel arc occurs, the +ve input 5 of second comparator 252 is greater than the −ve input 4. This is because low pass filter 214 filters the voltage due to the initial current transient of the arc, introducing a time delay. Second comparator 252 outputs a parallel arc detection signal to a second input of OR Gate 210 when a voltage at the output of delay circuit 217 is less than a voltage at the output of reference circuit 219.

When either a series or parallel arc occurs, OR Gate 210 produces an output signal at pin 1, indicating an arc fault that is sensed by signal transformer 300. Referring back to FIG. 2, signal transformer 300 includes Schmitt Trigger 310 and J-K Flip-Flop 312. The output signal from OR Gate 210 is received by input 5 of Schmitt Trigger 310. Schmitt Trigger 310 output at pin 8 is fed to a clock input pin 3 of J-K Flip Flop 312. Under fault J-K Flip Flop 312 is set with the rising edge of the input clock at pin 3, a complementary output of the Q at pin 2 of J-K Flip Flop 312 goes from High to Low during fault. Under normal conditions pin 2 is High. The output signal from pin 2 is fed to an input 11 of an OR Gate 602 included in Switch Controller 600.

Figure 4:
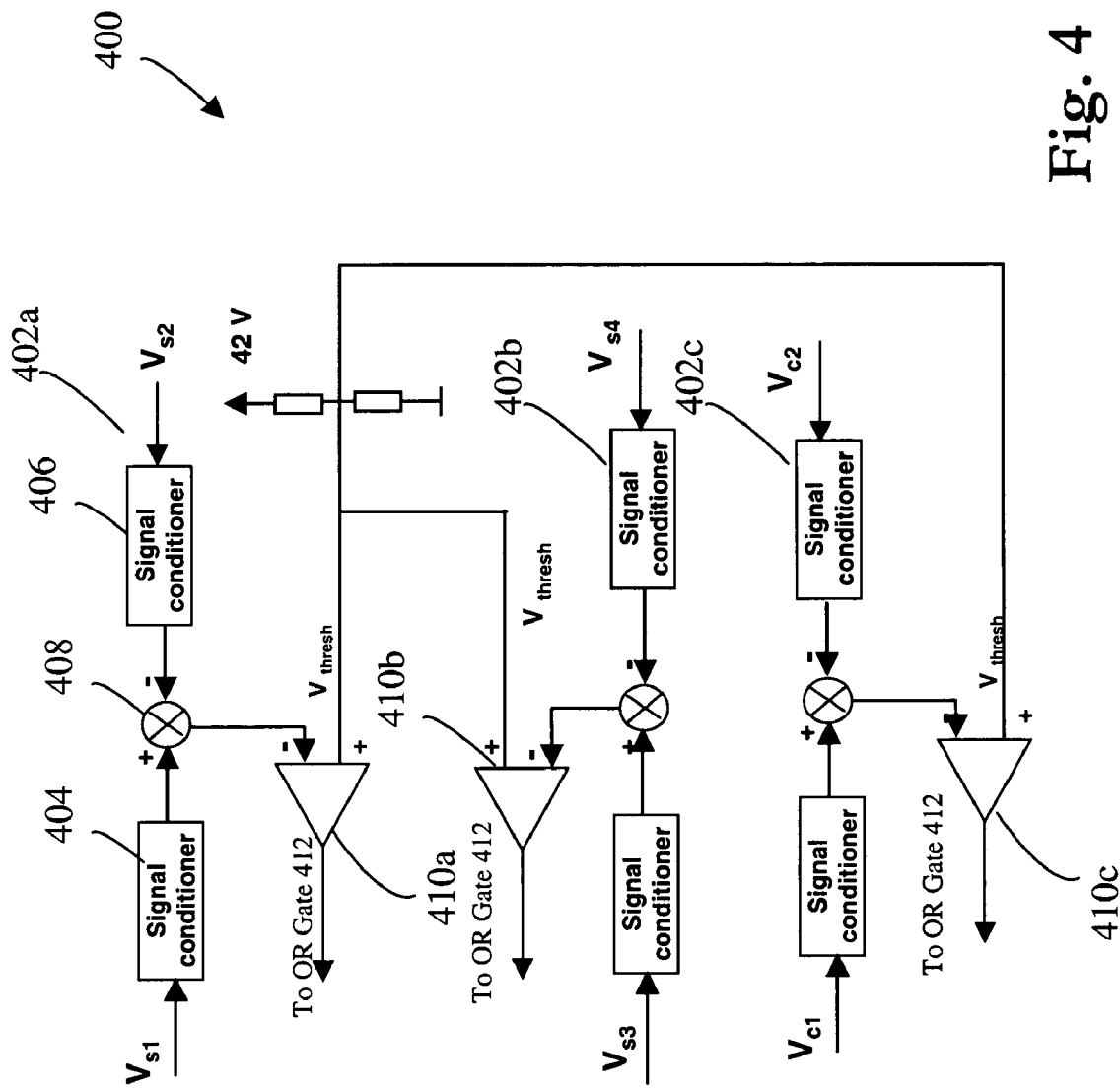
FIG. 4 is a circuit diagram illustrating another aspect of a fault detector in accordance with the present invention.

Referring to FIGS. 2 and 4, switch transient detector 400 includes a switch transition detection circuit 402a, 402b, 402c for each switch being monitored. As shown on FIG. 4, switch transition detection circuit 402a senses a voltage $v_{s1}$, $v_{s2}$ on each side of load switch 30a. The voltages $v_{s1}$, $v_{s2}$ are each fed through a respective signal conditioner 404, 406 fed to a summing amplifier 408. A voltage differential is output by summing amplifier 408 and fed to a comparator 410 where the differential voltage is compared to a reference voltage with a reference value preferably set between 6 and 10 volts. Switch transition circuits 402b, 402c are structured and function similar to switch transition circuit 402a. The output of the respective comparators 410a, 410b, 410c associated with each monitored switch 30a, 30b, 700 is fed to an OR Gate 412. Under normal conditions, the voltages differential across each of the switch terminals 30a, 30b, 700 and the output of the switch transient detector 400 are Low. A switch 30a, 30b, 700 opening under load creates an arc across the switch, which causes voltage drop across the switch. Under this condition, the output of switch transient detector 400 goes High. The outputs from each of the switch transition detection circuit 402a, 402b, 402c are fed to the input pins 2, 3, and 4 of OR Gate 412. The output of OR Gate 412 is fed to an input 10 of Or Gate 602.

Manual switch 500 enables line interrupter 700 to be manually reset. Manual switch 500 functions to provide a mechanism to manually close and open line interrupter 700. Line interrupter 700 functions to disconnect an arc fault from power source 24. Manual switch 500 is a single pole double throw switch with a first pole grounded. A second pole is connected to a 15V supply derived from power supplied from 48V battery 24 by using linear regulators 502a, 502b. Two regulators 502a, 502b are cascaded to reduce power dissipation in the individual devices. The second pole is connected to a pin 9 of an AND Gate 604 included in Switch Controller 600. The second pole is also ground through capacitor 504 and resistor 506. Under normal operation, manual switch 500 is closed and the input 9 to AND Gate 604 is High while the input pin 10 of AND Gate 604 is also High. Therefore, the output of AND Gate 604 is also High under normal operation thereby driving an n-p-n transistor 606 via a buffer 608. The collector of transistor 606 is connected to 48V power supply (battery 24) via a 15K resistor 610. The collector output is connected to line interrupter 700. Preferably, line interrupter 700 is a static relay configured to close with zero input signal and open with 48V input signal. Under normal operation, line interrupter 700 is closed.

Under an arc fault condition, output pin 8 of Schmitt Trigger 310 feeds a signal to input pin 3 of Flip Flop 312 thereby setting Flip Flop 312. Consequently, output pin 2 of Flip Flop 312 goes Low which is fed to input pin 11 of OR Gate 602. Since all of the inputs (9, 10, 11, 12) of OR Gate 602 are Low, the output at pin 13 is Low. This Low output is fed to input pin 10 of AND Gate 604. The signal from manual switch 500 is fed to input pin 9 of AND Gate 604. The output 13 of AND Gate 604 is buffered by buffer 608 and fed to base of transistor 606 to turn OFF. This causes the line interrupter 700 to trip.

Once line interrupter 700 trips, J-K Flip Flop 312 is in a set condition where pin 2 is Low. By opening and closing, manual switch 500 disconnects the 15V power supply and connects to input pin 1 of Schmitt Trigger 310 via capacitor 504 and an amplifier 508. This produces a voltage spike across resistor 506 since R–C (resistor 506–capacitor 504) combination acts as a differentiator. This pulse is fed to input pin 1 of Schmitt Trigger 310. Output pin 2 is connected to input pin 3 producing a pulse of finite pulse width at output pin 4 of Schmitt Trigger 310. This pulse width depends on the R–C time constant of resistor 506 and capacitor 504. The output of pin 4 of Schmitt Trigger 310 is connected to reset pin 4 of J-K Flip Flop 312 and also to the input pin 9 of OR Gate 602. The J-K Flip Flop 312 resets and thus makes the output pin 2 High, which is connected to the input pin 11 of OR Gate 602. The output 13 of OR Gate 602 is High and fed to input pin 10 of AND Gate 604. Since two inputs (9 and 10) of AND Gate 604 are High it output at pin 13 is High driving the collector of transistor 606 to Low. This Low signal to the input of line interrupter 700 closes line interrupter 700. Line interrupter 700 may be opened manually such as by connecting manual switch 500 to ground, causing the output 13 of AND Gate 604 to go Low, thus tripping line interrupter 700. Line interrupter 700 can be closed manually by connecting manual switch 500 to 15V power supply.

Figure 5:
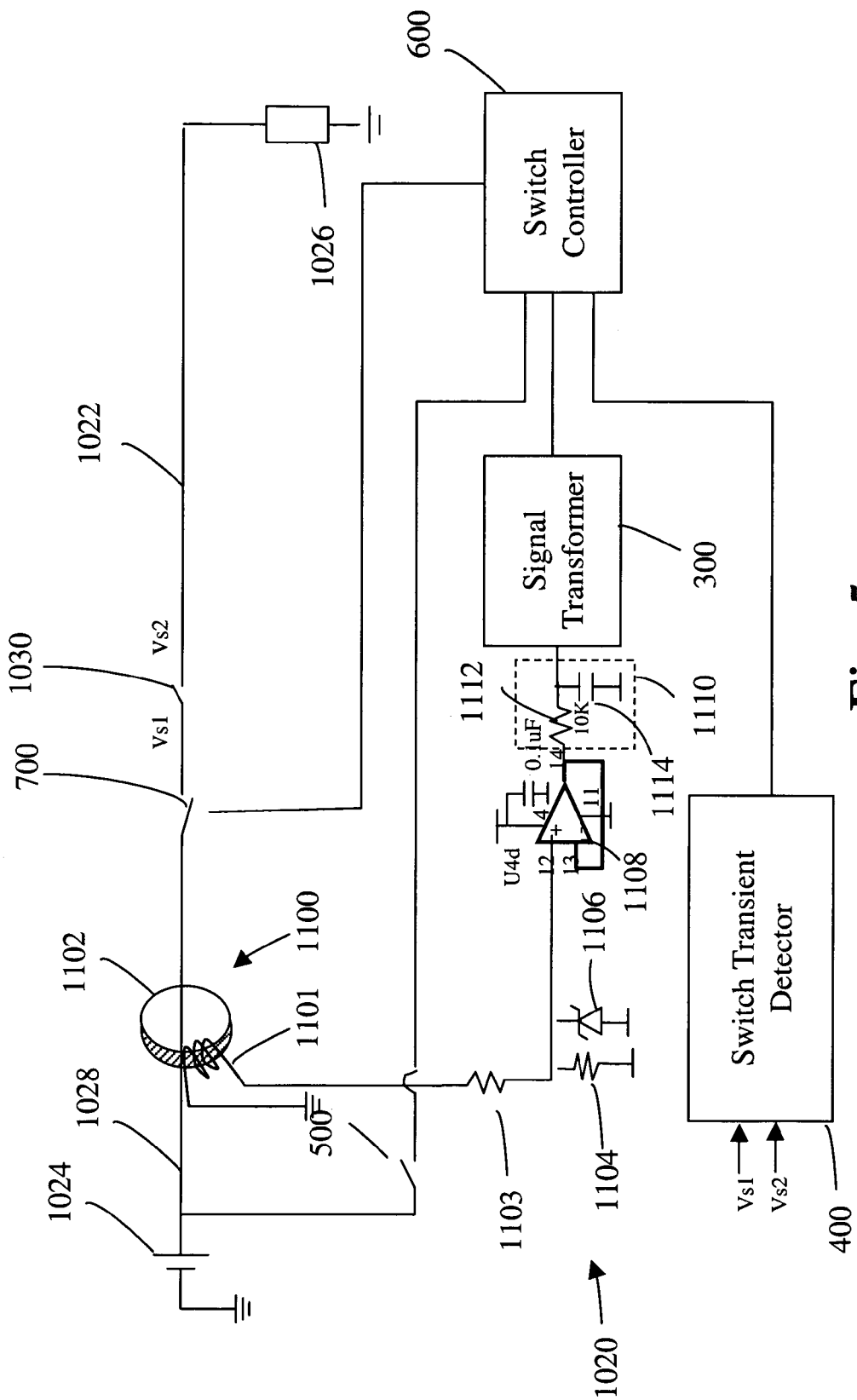
FIG. 5 is a simplified block diagram of a system incorporating a second exemplary embodiment of an arc fault detector in accordance with the present invention.
Figure 6:
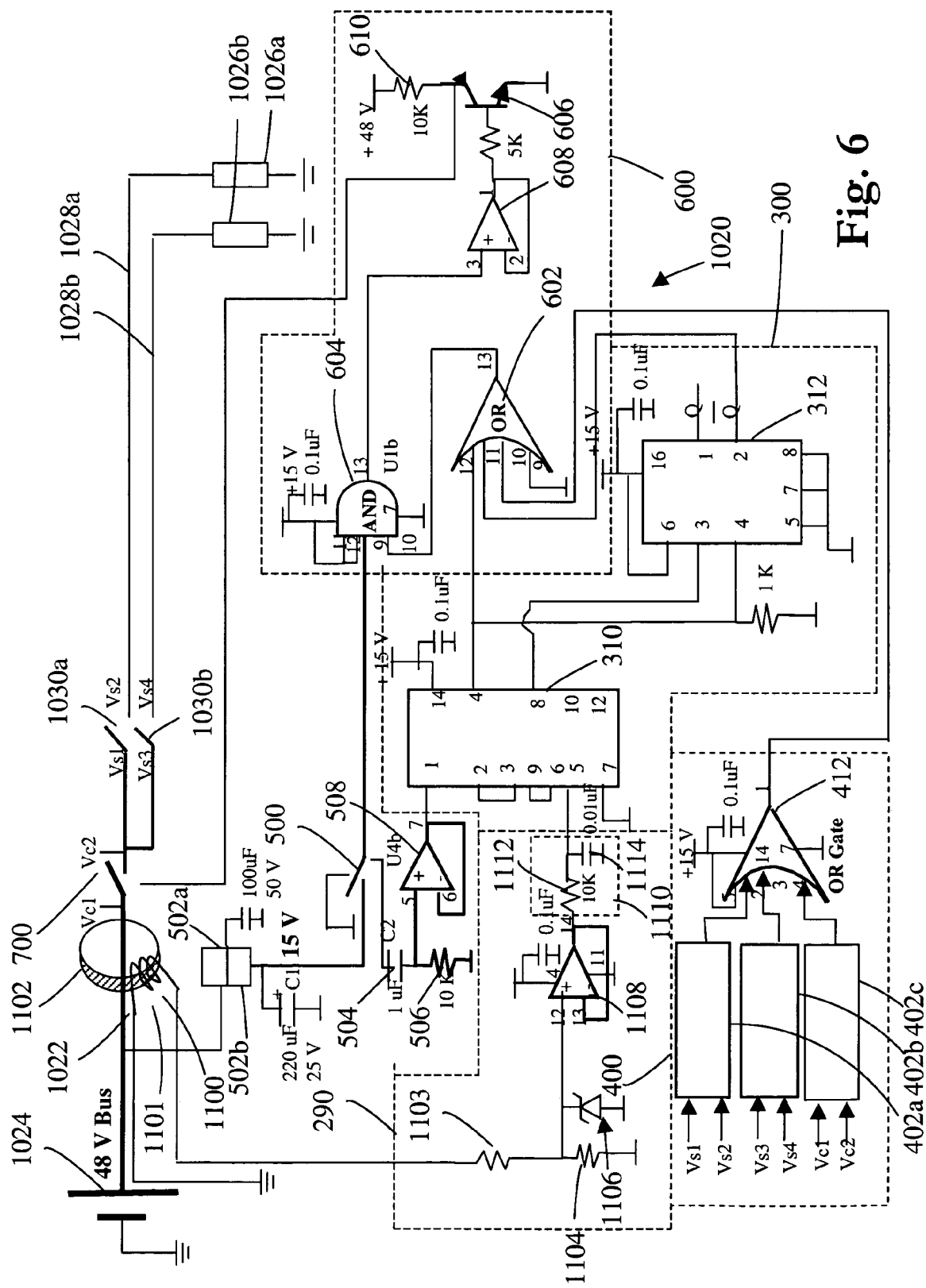
FIG. 6 is a circuit diagram of a system incorporating an exemplary embodiment of an arc fault detector in accordance with the present invention.

Referring now to FIGS. 5–6, FIGS. 5 and 6 illustrate a second exemplary embodiment of an arc fault detector according to the present invention.

FIG. 5 is a simplified diagram illustrating a second exemplary embodiment of an arc fault detector 1020 of the present invention. As shown on FIG. 5, arc fault detector 1020 provides protection to circuit 1022. Circuit 1022 includes direct current power source or battery 1024 providing power to load 1026 via conductor 1028. Load switch 1030 is disposed in conductor 1028.

Arc fault detector 1020 includes current monitor 1100 detecting a rate of change in electrical current in circuit 1022 and producing a first signal indicative of the rate of change.

Arc fault detector 1020 further includes a filter 1110 connected in series with current monitor 1100. The filter functioning to filter the first signal to substantially eliminate signals outside a selected frequency range, filter 1110 outputting a filtered signal representing changes in electrical current within the selected frequency range. Arc fault detector 1020 also includes arc determiner (preferably Schmitt Trigger 310) producing an arc detection signal when a voltage level of the filtered signal exceeds at least one threshold, such as a threshold established by Schmitt Trigger 310. Another device, such as amplifier 1108, a comparator, or the like, may also be used to provide a threshold. Another device such as a mono-stable vibrator may also be used for this purpose.

Arc fault detector 1020 includes current monitor 1100 and arc determining circuit 290. Current monitor 1100 includes coil 1101 wrapped around a toroidal core or UI core 1102. Arc determining circuit 290 includes attenuator or first resistor 1103, second resistor 1104, zener diode 1106, operational amplifier 1108, and low pass filter 1110. Low pass filter 1110 includes resistor 1112 and capacitor 1114. Arc fault detector 1020 further includes signal transformer 300, switch transient detector 400, manual switch 500, switch controller 600, and line interrupter 700.

Circuit 1022 passes within (e.g., through the center of) toroidal core 1102 inducing a voltage pulse in coil 1101 due to a current change caused by a series or parallel arc fault. Attenuator or resistor 1103 is configured such that the voltage level of the filtered signal output to Schmitt Trigger 310, when generated by operation of a motor commutator, is lower than the threshold voltage needed to be provided to Schmitt Trigger 310 to enable an output pulse to be generated.

Resistor 1104 provides a path to ground for the voltage pulse. The voltage is provided to operational amplifier 1108 via zener diode 1106, which clamps the voltage to 12V to protect downstream components in the event the induced voltage is too high.

Signal transformer 300, switch transient detector 400, manual switch 500, switch controller 600, and line interrupter 700 of arc fault detector 1020 are configured and operate as described in the exemplary embodiment of arc fault detector 20 above.

Figure 7:
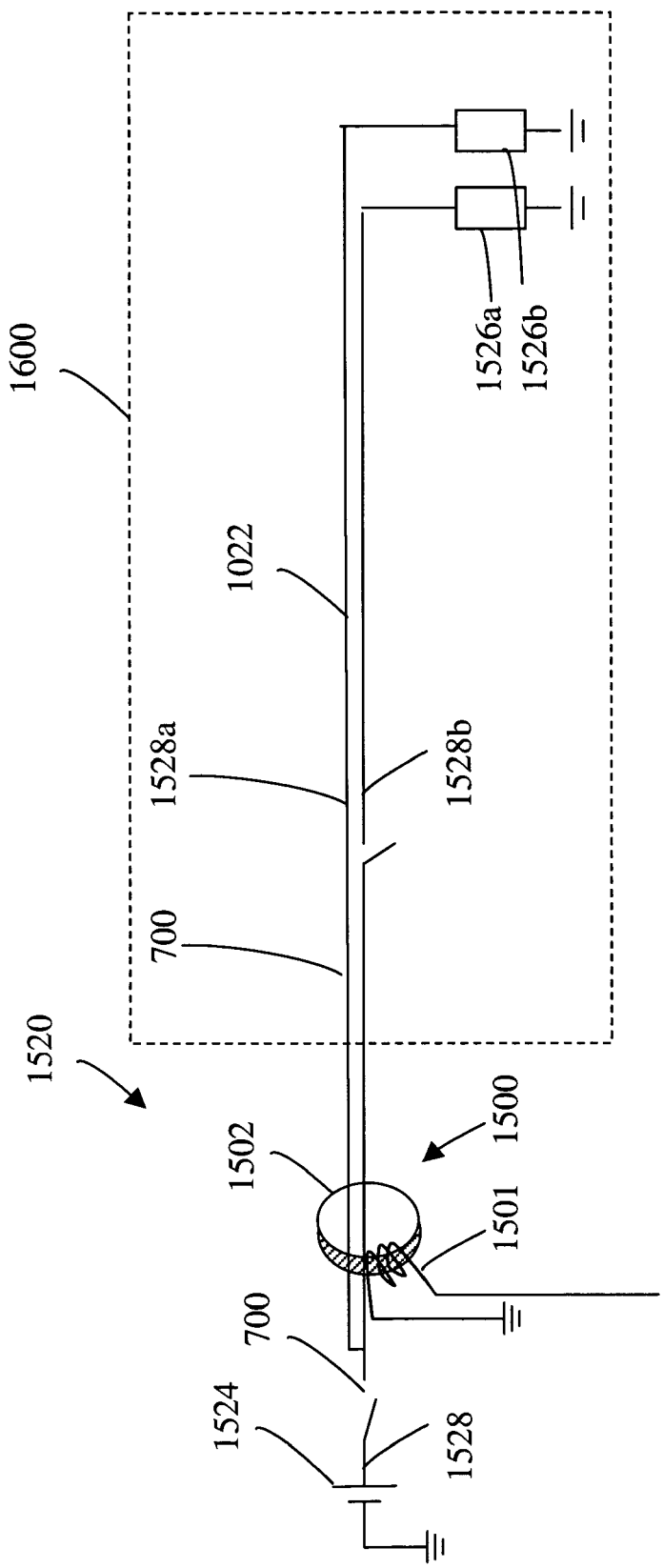
FIG. 7 is a simplified view illustrating an aspect of the present invention.

FIG. 7 is a fragmentary simplified diagram illustrating how coil 1501 wrapped around a toroidal core 1502 is used as part of an arc fault detector 1520 protecting a zone 1600.

As shown on FIG. 7, arc fault detector 1520 provides protection to a circuit 1522 and zone 1600. Circuit 1522 includes a direct current power source or battery 1524 providing power to loads 1526a, 1526b via respective conductors 1528a, 1528b. Line interrupter 700 is disposed in circuit 1522. Both conductors 1528a, 1528b pass through the center of toroidal core 1502. When a current changes due to arc fault occurring in either conductor 1528a, 1528b, a voltage is induced in coil 1501. An arc determining circuit, signal transformer, switch transient detector, manual switch, switch controller, and line interrupter 700 may be incorporated in arc fault detector 1520 as described above.

Figure 8:
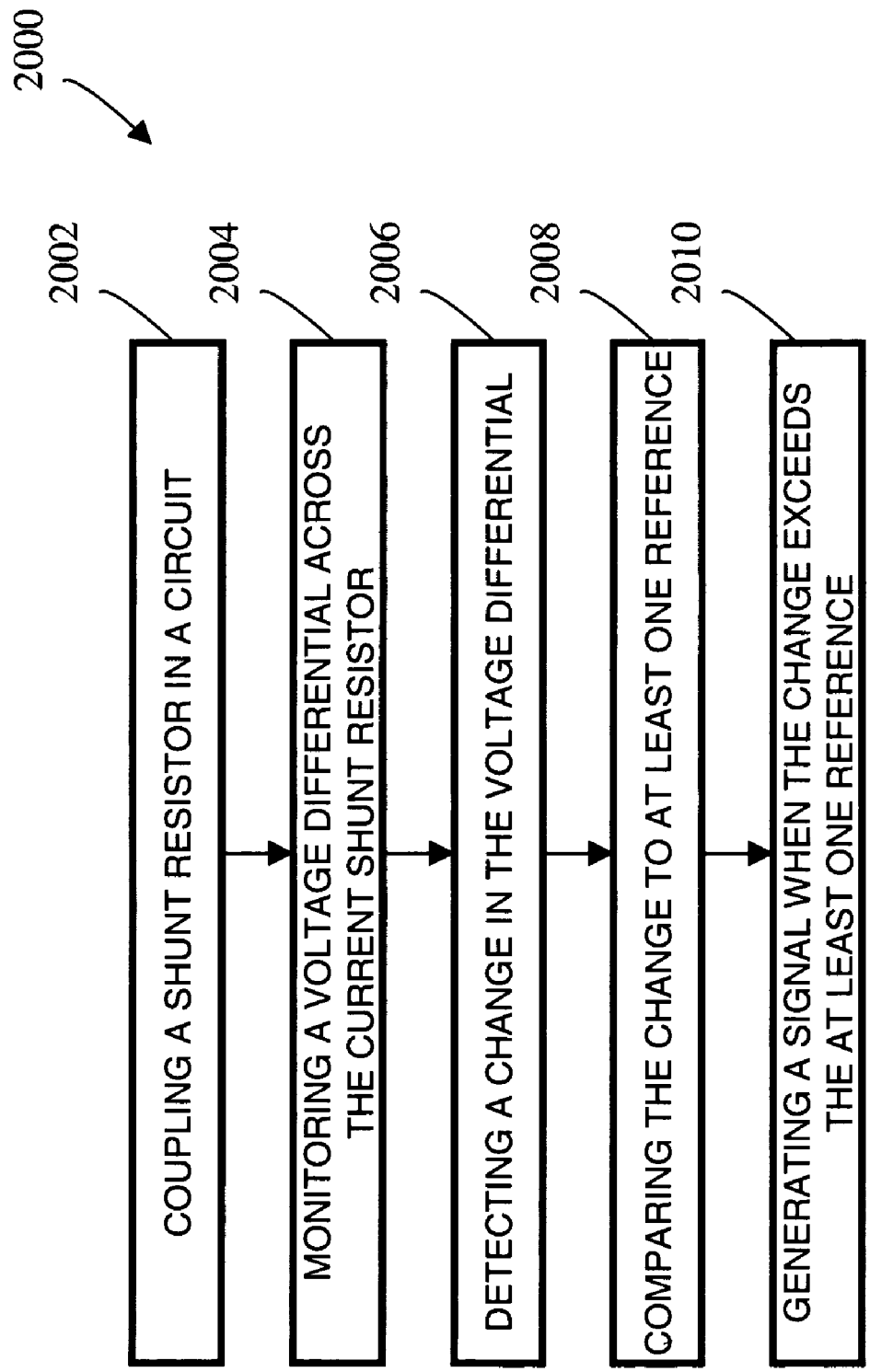
FIG. 8 is a flow diagram of an exemplary method in accordance with the present invention.

As shown on FIG. 8, an exemplary method 2000 for detecting an arc fault in a circuit in accordance with present invention includes providing a shunt resistor in the circuit 2002, monitoring a voltage differential across the shunt resistor 2004, detecting a change in the voltage differential 2006, comparing the change to at least one threshold 2008, and generating a signal when the change exceeds the at least one threshold 2010.

Figure 9:
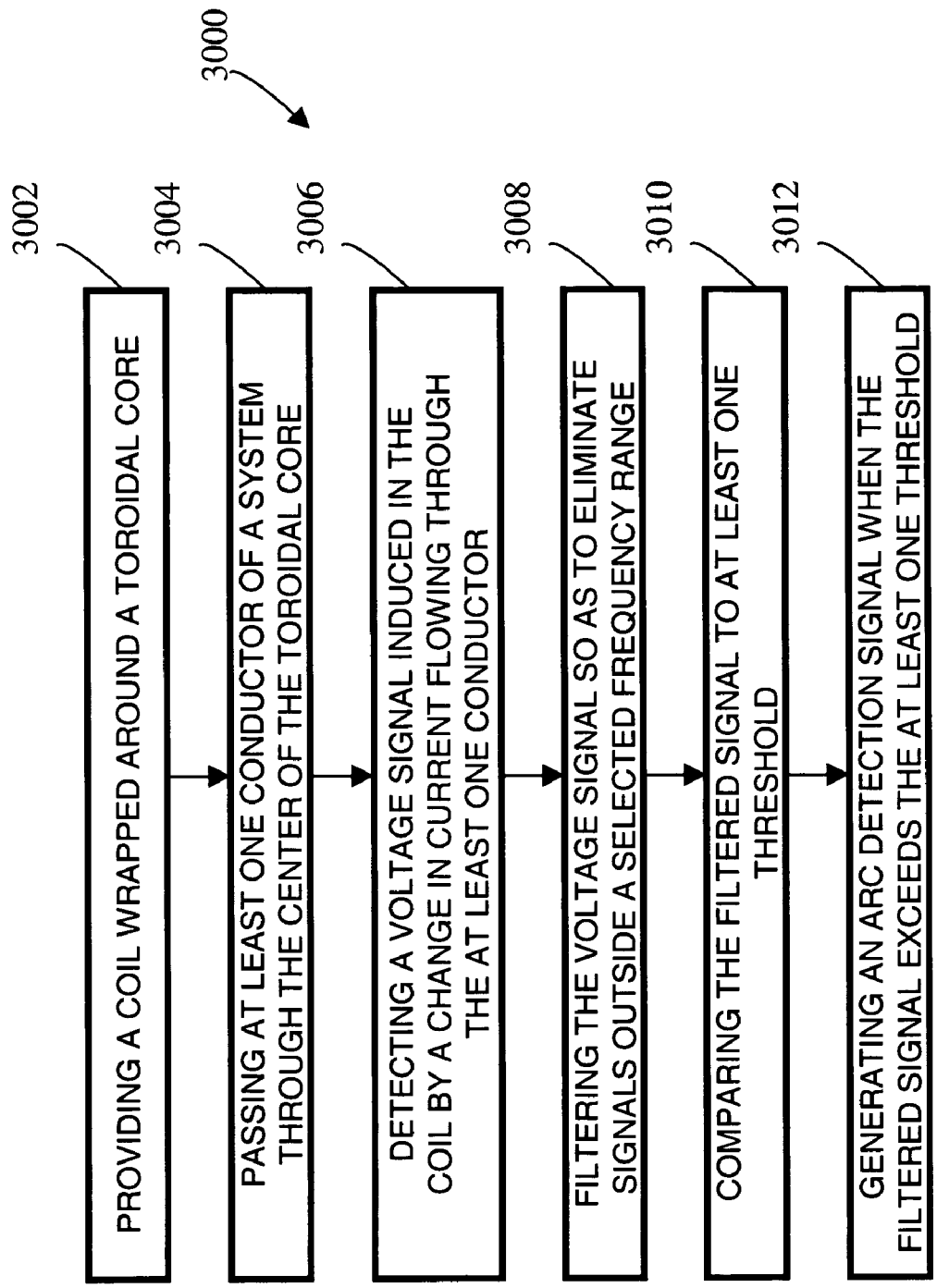
FIG. 9 is a flow diagram of an exemplary method in accordance with the present invention.

As shown on FIG. 9, an exemplary method 3000 of detecting an arc fault in a system includes providing a coil wrapped around a toroidal core 3002; passing at least one conductor of the system through the center of the toroidal core 3004; detecting a voltage induced in the coil by a change in current flowing through the at least one conductor 3006; comparing the voltage to at least one threshold 3008; and generating a signal when the voltage exceeds the at least one threshold 3010.

The exemplary embodiments shown and described herein are provided merely by way of example and are not intended to limit the scope of the invention in any way. The various dimensions, ratios, materials and construction techniques are illustrative only and are not necessarily required to practice the invention. It is intended that the scope of the present invention herein disclosed should not be limited by the particular disclosed embodiments herein. Further modifications and alterations may occur to others upon reading and understanding the specification.

For example, in an exemplary embodiment, line interrupter 700 may be embodied as a static relay. Line interrupter 700 may also be an electromechanical switch, a thyristor, an intelligent switch, or the like. It should also be noted that Schmitt Trigger 310 and J-K Flip Flop 312 may be replaced by other devices that provide pulsed signals such as mono-stable multi-vibrators, bi-stable multi-vibrators, timers, latches, or the like.

Further, the various embodiments discussed above may be suitably configured as a combination of hardware and software and microprocessor elements, where appropriate, without departing from the scope of the present invention. The present invention has been described above with reference to various embodiments. However, those skilled in the art will recognize that changes and modifications may be made to these embodiments without departing from the scope of the present invention. For example, the various components may be implemented in alternate ways, such as, for example, as combinations of hardware, software, and microprocessor elements, depending upon the particular application or in consideration of any number of factors associated with the operation of the system. In addition, the techniques described herein may be extended or modified for use with other circuits. These and other changes or modifications are intended to be included within the scope of the present invention, as expressed in the following claims.

Having thus described the invention, what is claimed is:

1. An arc fault detector for a circuit comprising:
 a current shunt resistor coupled in series with said circuit; and
 an arc discriminator comprising an amplifier sensing a first voltage on a first side of said current shunt resistor, sensing a second voltage on a second side of said current shunt resistor, and producing a first signal proportional to a current flow through said current shunt resistor, said arc discriminator further comprising a change detector receiving said first signal as input and producing an arc fault detection signal as output when said change detector detects a change in said first signal indicative of a presence of an arc fault in said circuit;
 wherein said change detector comprises a first splitter receiving said first signal as input and providing a second and a third signal as outputs, a delay circuit receiving said second signal as input and producing a delayed signal having a predetermined delay as output, a reference circuit receiving said third signal as input and producing a reference signal as output, and a comparator receiving said delayed signal and said reference signal as inputs, and producing said arc fault detection signal as an output when a difference between said reference signal and said delay signal satisfies a predetermined criteria.

2. The arc fault detector as recited in claim 1 wherein said delay circuit comprises an R-C circuit.

3. The arc fault detector as recited in claim 1 wherein said delay circuit comprises a low pass filter.

4. The arc fault detector as recited in claim 3 wherein said reference circuit comprises an amplifier.

5. The arc fault detector as recited in claim 4 wherein said first splitter comprises a buffer.

6. The arc fault detector as recited in claim 1, wherein said change detector comprises a series arc detector and a parallel arc detector.

7. An arc fault detector for a circuit comprising:
a current shunt resistor coupled in series with said circuit; and
an arc discriminator comprising an amplifier sensing a first voltage on a first side of said current shunt resistor, sensing a second voltage on a second side of said current shunt resistor, and producing a first signal proportional to a current flow through said current shunt resistor, said arc discriminator further comprising a change detector receiving said first signal as input and producing an arc fault detection signal as output when said change detector detects a change in said first signal indicative of a presence of an arc fault in said circuit;
wherein said change detector comprises a first buffer having an input coupled to said amplifier, said first buffer having a first and second output; a delay circuit coupled to said first output of said first buffer, said delay circuit providing a delayed signal as an output; a reference circuit coupled to said second output of said first buffer, said reference circuit providing a reference signal as an output; a first comparator having a first input coupled to said delay circuit and a second input coupled to said reference circuit, wherein said first comparator is configured to provide a series arc detection signal only when there is a decrease in voltage of said first signal which thereby causes the voltage of said reference signal to be less than said voltage of said delayed signal; and a logic gate having a first input coupled to said first comparator, said logic gate being configured to generate said arc fault detection signal as an output when said series arc fault detection signal is detected by said first input.

8. An arc fault detector for a circuit comprising:
a current shunt resistor coupled in series with said circuit; and
an arc discriminator comprising an amplifier sensing a first voltage on a first side of said current shunt resistor, sensing a second voltage on a second side of said current shunt resistor, and producing a first signal proportional to a current flow through said current shunt resistor, said arc discriminator further comprising a change detector receiving said first signal as input and producing an arc fault detection signal as output when said change detector detects a change in said first signal indicative of a presence of an arc fault in said circuit;
wherein said change detector comprises a first buffer having an input coupled with said amplifier, said first buffer having a first and second output; a delay circuit coupled to said first output of said second buffer, said delay circuit providing a delayed signal as an output; a reference circuit coupled to said second output of said first buffer, said reference circuit providing a reference signal as an output; a second comparator having a first input coupled to said delay circuit and a second input coupled to said reference circuit, wherein said second comparator is configured to provide a parallel arc detection signal only when there is a increase in voltage of said first signal which thereby causes the voltage of said reference signal to be greater than said voltage of said delayed signal; and a logic gate having a second input coupled to said second comparator, said logic gate being configured to generate said arc fault detection signal as an output when said parallel arc fault detection signal is detected by said second input.

9. A method of detecting an arc fault in a circuit comprising:
coupling a current shunt resistor in said circuit;
monitoring a voltage differential across said current shunt resistor;
detecting a change in said voltage differential;
comparing said change to at least one threshold; and
generating a signal when said change exceeds said at least one threshold;
wherein said step of monitoring comprises sensing a first voltage on a first side of said current shunt resistor and sensing a second voltage on a second side of said current shunt resistor,
wherein said change is proportional to a current flow through said current shunt resistor; and
wherein said threshold is indicative of a presence of an arc fault in said circuit.

* * * * *